United States Patent [19]

Matthews et al.

[11] 4,227,237
[45] Oct. 7, 1980

[54] ELECTRONIC COMPONENT CABINET

[75] Inventors: Terrence H. Matthews; Brian K. White, both of Ottawa, Canada

[73] Assignee: Mitel Corporation, Kanata, Canada

[21] Appl. No.: 933,539

[22] Filed: Aug. 14, 1978

[30] Foreign Application Priority Data

May 24, 1978 [CA] Canada ................................. 303988

[51] Int. Cl.² ................................................. H02B 102
[52] U.S. Cl. .................................... 361/415; 361/391
[58] Field of Search ................................ 361/391, 415

[56] References Cited

U.S. PATENT DOCUMENTS

| | | | |
|---|---|---|---|
| 3,131,330 | 4/1964 | Allen | 361/415 |
| 3,316,461 | 4/1967 | Henke et al. | 361/391 |
| 4,084,250 | 4/1978 | Albertine et al. | 361/394 |

FOREIGN PATENT DOCUMENTS

| | | | |
|---|---|---|---|
| 2620758 | 11/1977 | Fed. Rep. of Germany | 361/415 |
| 2709707 | 9/1978 | Fed. Rep. of Germany | 361/415 |
| 2704671 | 10/1978 | Fed. Rep. of Germany | 361/380 |
| 6410049 | 3/1965 | Netherlands | 361/415 |
| 1004011 | 9/1965 | United Kingdom | 361/415 |
| 1306234 | 2/1973 | United Kingdom | 361/415 |

*Primary Examiner*—David Smith, Jr.
*Attorney, Agent, or Firm*—Craig & Antonelli

[57] ABSTRACT

A cabinet for housing electronic components such as printed circuit boards, providing maximum density of storage yet allowing easy access to each board for insertion or removal. The cabinet is comprised of a base member, and an elongated generally U-shaped cover member having a pair of legs adjoining an outer surface, having an open side generally facing the base member and at least one open end. A pair of parallel channel members are disposed opposite and facing each other along the inside of the legs of the cover member, with one end of each of the channel members facing the open end of the cover member. Further means is utilized for hinging the other end of the cover member relative to the base whereupon the open end can be swung away from the base.

10 Claims, 5 Drawing Figures

ELECTRONIC COMPONENT CABINET

This invention relates to a cabinet for housing electronic components such as printed circuit boards and is particularly adapted to allow easy access to and removal of the printed circuit boards when a plurality such cabinets are closely mounted on a rack.

Rack-mounted equipment which utilize plug-in printed circuit boards or similar components generally mount the printed circuit boards vertically with their edges toward the front of the rack. This allows easy access to the boards, since they can be removed simply by pulling them forward after unlatching whatever locking mechanism might be used.

While such equipment has been successfully used in the past, there have remained a number of associated problems. For example, the depth of the frame must be sufficient to contain the printed circuit boards front-to-back. The frame itself must therefore carry the entire printed circuit board (or an auxiliary cabinet of similar depth) as well as the backplane wiring.

Further, the number of boards which can be carried on a particular standard size rack face area is limited by the thickness of the printed circuit boards including their components with additional safety allowance to ensure that short circuits between adjacent boards do not occur. The number of circuit boards which can be carried on a rack is therefore a function of their width and component thickness.

The present invention is directed to a cabinet for housing components such as printed circuit boards which allows the printed circuit boards to be stacked parallel to the front of the frame. The number of printed circuit boards which can be accommodated therefore becomes a function of how far forward of the frame is tolerable for a stack. While a number of such cabinets mounted to the front of a frame would be expected to cause an access problem, the inventive cabinet allows full access to the printed circuit boards for their removal, the use of printed circuit board extenders etc.

As a further advantage resulting from this invention, the frame for mounting the inventive cabinet need only be comprised of means for mounting the cabinet, and a wiring backplane. A considerably narrower, and therefore less expensive frame can be used than previously.

Further, with all the printed circuit boards in position, the preferred embodiment of the invention provides a fully protective enclosure for the boards from dust or accidental jarring, and it further presents a neat and unobtrusive appearance.

The invention, in general, is a cabinet for housing at least one printed circuit board comprising a base member and an elongated generally U-shaped cover member having a pair of legs adjoining an outer surface, having an open side generally facing the base member and at least one open end. A pair of parallel channel members are disposed opposite and facing each other along the inside of the legs of the cover member, with one end of each of the channel members facing the open end of the cover member. Further means is utilized for hinging the other end of the cover member relative to the base whereupon the open end can be swung away from the base.

A better understanding of the invention will be obtained by reference to the detailed description below, and to the following figures.

Figure 1:
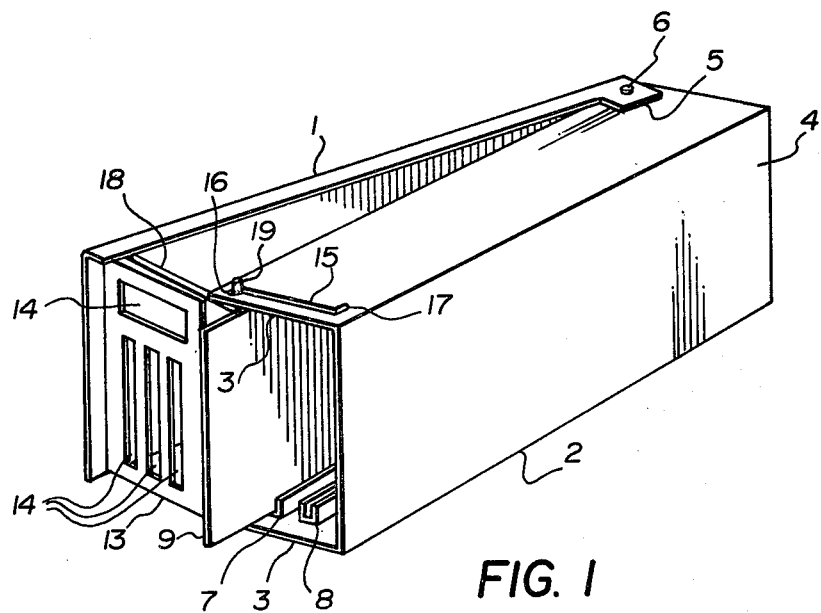
FIG. 1 is a perspective view of the housing in open position.

Turning first to FIGS. 1, 2, 4 and 5, the invention is comprised of a base member 1. The base member typically has means for mounting it on a rack such as threaded studs, screw holes, etc., which means are well-known and thus will not be described further.

A generally U-shaped cover member 2 is comprised of a pair of legs 3 and an outer surface 4.

The cover member is hinged at its bottom end adjacent the base. A manner of hinging which is preferred is to provide a pair of lips 5 of the base member (only one of which is shown) overlapping the cover, although the invention is not restricted to this form of hinge. The lips are rotatably pinned utilizing rivets 6 or the like, to allow the cover to swing thereabout.

Figure 2:
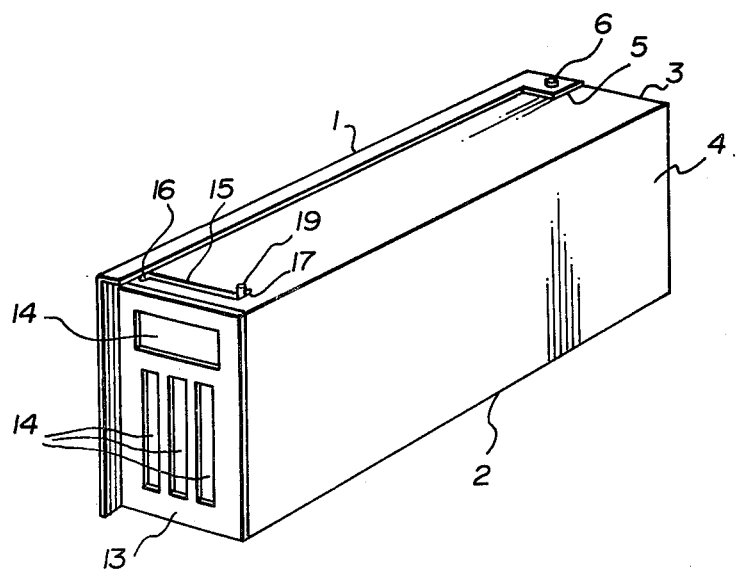
FIG. 2 is a perspective view of the housing in closed position.

Clearly the cover member 2 can swing into a position against the base 1 as shown in FIG. 2, or away from the base as shown in FIG. 1.

Means is also provided for holding printed circuit boards or the like in position. A pair of parallel channel members 7 (only the bottom one of which is visible in FIG. 1) containing slots adequate to retain the printed circuit board thickness are disposed on the opposite inside surface of the legs of the cover member, parallel and facing each other. A second channel member 8 is also shown in FIG. 1; the number of channel members to be utilized is determined by the number of printed circuit boards to be housed within the cover member 2 in parallel disposition. For example, there may be five or more sets of channel members utilized.

A connector to mate with the printed circuit board or mating connector is fixed to the end of the cover member 2 opposite the open end between each pair of opposing channel members.

A printed circuit board 9 is slid into the opposing slots within channel members 7, and is held in position. As it is pushed into the cover member 2 and into engagement with the connector at the other end of the channel members, the front of the printed circuit board 9 moves entirely within the cover member 2.

Thus a plurality of printed circuit boards 9 can be located in parallel relationship within the cover member 2.

Once all of the printed circuit boards are in location, the cover member can be moved into disposition against the base member 1, thus closing it.

Figure 3:
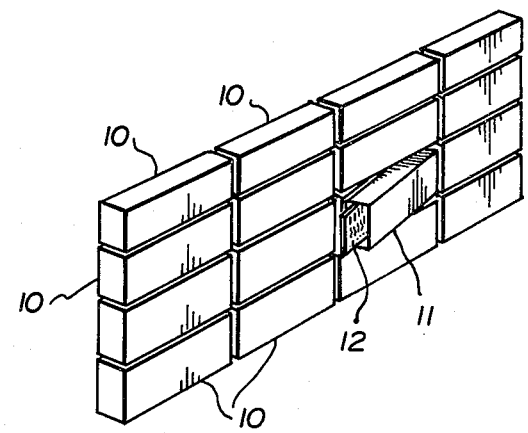
FIG. 3 is a perspective view of a plurality of the housings as they would appear when mounted on a rack.

Turning to FIG. 3, a plurality of the above-described housings 10 are shown mounted on a rack. One of the housings 11 has been swung into its open position and it is clear that access may be had to the printed circuit boards 12 contained therein. One of the printed circuit boards 12 is shown extending from the open housing, as it would appear as it is being removed. If desired, a printed circuit board extender can be utilized, to allow full servicing of the apparatus if needed while the printed circuit boards remains connected in the rack.

It should be noted that to accommodate more printed circuit boards, the housing legs 3 need merely be made longer thus enlarging the housing. Additonal channel pairs for holding printed circuit boards would be utilized, and additional printed circuit boards thus could be located in parallel with the others within the housing.

Returning to FIGS. 1 and 2, an end cover or end flap 13 is attached orthogonally to the base 1 adjacent the open end of the cover member 2. End flap 13 is of similar size as the opening formed by the cover member when in position against the base member 1, and therefore protects the interior components and forms an end to the entire enclosure when the cover member 2 is closed. The opposite end of the cover member 2 may remain open to allow wiring to extend from the aforenoted connectors, or can be closed, with access holes being located in the cabinet for egress of connector wires.

Preferably the end flap 13 may also contain slots 14 to allow air to circulate, if protection from dust and accidental jarring is not considered to be a problem.

Instead of the end flap 13, or as part thereof, a guide can be provided attached to the base, to provide alignment and prevent sag of the cover member 2.

In a major advantage of the invention, the cabinet includes means for latching the cover member in one of the two positions. The preferred form of the latch is comprised of a wire spring which is biased within a slot as will be described below with reference to FIGS. 4 and 5, but which is also visible in FIGS. 1 and 2.

One of the legs 3 of the cabinet contains a slot 15 which runs parallel to the end of the cover member. The ends of the slot 15 are formed into slots extensions 16 and 17. While the slot extensions 16, 17 are shown extending in opposite directions in FIGS. 1, 2 they need not do so, although it is preferred that they do.

A spring wire 18 extends outwardly from the base member 1. It can be fastened using well known means such as being swaged into a hole, but must extend stiffly outwardly within the housing opposite the slot 15.

The end of the spring wire 18 is turned 90 degrees to form a spring extension 19, which extends into slot 15. Further, the spring wire 18 is biased in such manner that the spring extension 19 falls into slot extensions 16 or 17 when the cover member 2 is closed or open.

In case the slot extensions 16, 17 both are in the same direction, the spring wire 18 should be biased in that direction. To release the cover, member 22 the spring wire 18 is pushed into the plane of slot 15 whereupon the cover member can be moved to its closed or opened positions, allowing the spring extension 19 to slide within the slot 15. At its extreme position, the bias of the spring wire 18 causes the spring extension 19 to latch into the corresponding slot extension latching the cover into position.

Figure 4:
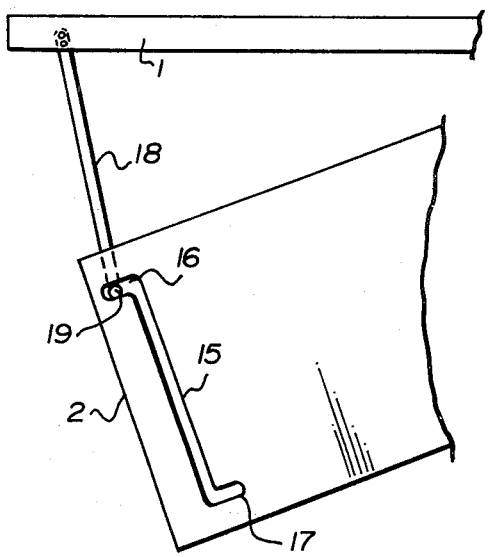
FIG. 4 is a schematic plan view of the cover latch for the housing with the cover in open position.
Figure 5:
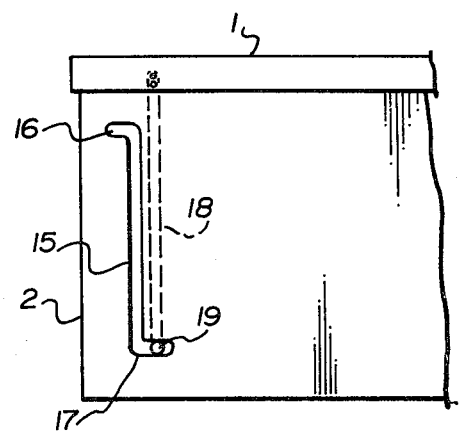
FIG. 5 is a schematic plan view of the cover latch for the housing with the cover in closed position.

In the preferred embodiment shown in large size in FIGS. 4 and 5, the slot extensions 16, 17 extend in opposite directions. It is preferred that the spring wire 18 be biased such that when the cover member 2 is in an intermediate position, that is with the spring extension 19 midway between the slot extensions 16 and 17 within slot 15, that there be no sideways pressure on the slot 15 by the spring extension. As the cover member 2 closes toward the base member 1, and the end of the slot 15 moves toward the plane of base member 1 the spring extension 19 is pushed in the direction of the end of the base member 1. This imparts a bending force on spring wire 18, and consequently when the cover member 2 is in position against base member 1, which places the spring extension 19 opposite slot extension 17, the spring extension 19 slips into slot extension 17 by the force of the tension built up in spring wire 18.

To release the cover member 2, spring extension 19 is manually pushed to a position in the plane of slot 15. Cover member 2 is then swung open, causing spring extension 19 to slide within slot 15. At a central position within slot 15, there is no discernible bias in spring wire 18. As the cover member 2 swings further outwardly, the end of slot 15 adjacent slot extension 16 moves away from the end of base member 1 in respect of the plane thereof. Accordingly, spring wire 18 is pushed in the opposite direction than previously, imparting tension thereto. As the cover member 2 swings to its open position, it is limited by the spring extension 19 meeting the end of slot 15. Due to the tension built up within spring wire 18, spring extension 19 latches into slot extension 16. The cover member 2 is thus held in its open position.

To release the cover member 2 again, spring extension 19 is manually moved into the plane of slot 15 allowing movement of the cover member 2 toward base member 1, as described above.

The cover member 2 thus can be latched in either of two positions, closed or open. In the closed, or operating position the equipment takes up minimum space while in the open position, printed circuit boards or other plug in components can be removed or inserted as described earlier.

While the above has described the preferred embodiment of the invention, a person skilled in the art of understanding the invention may now conceive of variations or other embodiments. All are considered within the sphere and scope of this invention as defined in the appended claims.

The embodiments of the invention in which exclusive property or privilege is requested are defined as follows:

1. A cabinet for housing at least one printed circuit board comprising a base member, an elongated generally U-shaped cover member having a pair of legs adjoining an outer surface, having an open side generally facing the base member, and having at least one open end, a pair of parallel channel members disposed opposite and facing each other along the inside of the legs of the cover member parallel to the outer surface, one end of each of the channel members facing the open end of the cover member, means for hinging the other end of the cover member relative to the base whereupon said open end can be swung away from the base, means for latching the open end of the channel member in position against the base and in a predetermined alternative position away from the base, one of the legs containing an enclosed narrow slot extending along one leg about parallel to said open end of the cover member, and the means for latching comprising a spring wire extending outwardly from the base along the leg, having an extension bent into the slot, whereby the extension is located adjacent one end of the slot with the cover member in position against the base and adjacent the other end of the slot with the cover member in position away from the base, thus limiting further movement of the cover member away from the base, and further including means for locking the extension in position at either end of the slot.

2. A cabinet as defined in claim 1, in which the slot has an orthogonal extension at both ends thereof, the spring being biased such that its extension engages the orthogonal extension of the slot with the cover member in position against the base and also in position away from the base.

3. A cabinet as defined in claim 2, in which the slot extensions extend in mutually opposite directions orthogonal to the slot; the spring exhibiting substantially no bias with the spring extension located in the slot approximately midway between the slot extensions, the spring extension being moveable by the sides of the slot in opposite directions as the cover member is moved into its position against or away from the base, whereby bias tension is imparted to the spring.

4. A cabinet as defined in claim 2 or 3 in which the means for hinging is comprised of a pair of lips of the base overlapping the legs of channel member at said other end of the cover member, and means rotatably pinning each lip to a corresponding adjacent leg.

5. A cabinet as defined in claim 2 or 3 in which the means for hinging is comprised of a pair of lips of the base overlapping the legs of channel member at said other end of the cover member, means rotatably pinning each lip to a corresponding adjacent leg and further including means for closing said open end of the cover member comprising an end flap orthogonally fixed to the base member adjacent said open end of the cover member of dimension approximately of the open end of the cover member when in position against the base.

6. A cabinet as defined in claim 1 or 3 further including a component connector facing inwardly of and fixed across the legs of the cover member at said other end adjacent both said channel members, whereby a mating connector of a component in sliding engagement with said channel members may be engaged by the component connector.

7. A cabinet as defined in claim 1 in which the means for hinging is comprised of a pair of lips of the base overlapping the legs of channel member at said other end of the cover member, and means rotatably pinning each lip to a corresponding adjacent leg.

8. A cabinet as defined in claim 1, further including means for closing said one end of the cover member comprising an end flap orthogonally fixed to the base member adjacent said open end of the cover member of dimension approximately that of the open end of the cover member when in position against the base.

9. A cabinet as defined in claim 1, further including means for closing said one end of the cover member comprising an end flap orthogonally fixed to the base member adjacent said open end of the cover member of dimension approximately that of the open end of the cover member when in position against the base, the end flap containing a plurality of slots.

10. A rack mounted assembly comprising a plurality of cabinets mounted in a horizontal array, each of the cabinets comprising a base member, a cover having an outer panel and a pair of upper and lower legs orthogonal to the outer panel, the cover being hinged so as to rotate about a vertical axis and to swing away from the base member, means for mounting a group of plug-in printed circuit boards in parallel relationship within each cover whereby one end of the group is swung away from the base member with the cover into an open position so as to clear an adjacent cabinet within the horizontal array, and means for retaining each of the covers in position parallel to the base members or in open position, to allow removal of one or more printed circuit boards of the group without interference with said adjacent cabinet of the array.

* * * * *